(12) United States Patent
Sekine et al.

(10) Patent No.: US 6,334,928 B1
(45) Date of Patent: Jan. 1, 2002

(54) SEMICONDUCTOR PROCESSING SYSTEM AND METHOD OF USING THE SAME

(75) Inventors: Makoto Sekine, Yokohama; Nobuo Hayasaka, Yokosuka; Katsuya Okumura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/239,793

(22) Filed: Jan. 29, 1999

(30) Foreign Application Priority Data

Jan. 30, 1998 (JP) .................................. 10-019664

(51) Int. Cl.[7] .............................. B01D 8/00; B01D 53/047
(52) U.S. Cl. ......................... 156/345; 118/61; 118/715; 118/724; 423/210
(58) Field of Search .................................. 423/210, 230, 423/235, 239.1, 240 S; 156/345; 118/715, 724, 61

(56) References Cited

U.S. PATENT DOCUMENTS

| | | | |
|---|---|---|---|
| 4,593,530 A | * | 6/1986 | Longsworth .................... 62/55.5 |
| 4,957,523 A | * | 9/1990 | Zarate et al. .................... 62/646 |
| 5,169,407 A | * | 12/1992 | Mase et al. ................. 129/25.01 |
| 5,363,369 A | * | 11/1994 | Webb et al. ..................... 370/392 |
| 5,363,396 A | | 11/1994 | Webb et al. ..................... 372/57 |
| 5,779,998 A | * | 7/1998 | Tom ............................... 423/210 |

OTHER PUBLICATIONS

Wolf et al, "Silicon Processing for the VLSI Era, vol. 1: Process Technology", P. 95, Jan. 1986.*

* cited by examiner

Primary Examiner—Felisa Hiteshew
Assistant Examiner—Kin-Chan Chen
(74) Attorney, Agent, or Firm—Finnegan, Henderson, Farabow, Garrett & Dunner, L.L.P.

(57) ABSTRACT

A semiconductor wafer etching system exhausts an exhaust gas including fluorocarbon gas to an exhaust line. Two traps, that are capable of trapping the fluorocarbon gas in the exhaust gas by cooled adsorption and releasing the adsorbed fluorocarbon gas by heating, are alternately arranged on the exhaust line. The two traps are alternately separated from the exhaust gas and regenerated on a regeneration line which serves to release the adsorbed fluorocarbon gas from the traps. The trap which is in the trap mode to adsorb the fluorocarbon gas is cooled to −120° C. or less. The trap which is in the regeneration mode to release the adsorbed fluorocarbon gas is heated to −100° C. or more.

28 Claims, 5 Drawing Sheets

| GAS | BEFORE TRAP | | AFTER TRAP |
|---|---|---|---|
| $C_4F_8$ | 30-60% | → | ~0% |
| $C_2F_6$ | PRESENT | → | ~0% |
| $CF_4$ | PRESENT | → | ~0% |
| $SIF_4$ | PRESENT | → | ~0% |
| CO | ~100% | → | ~100% |
| Ar | 100% | → | 100% |

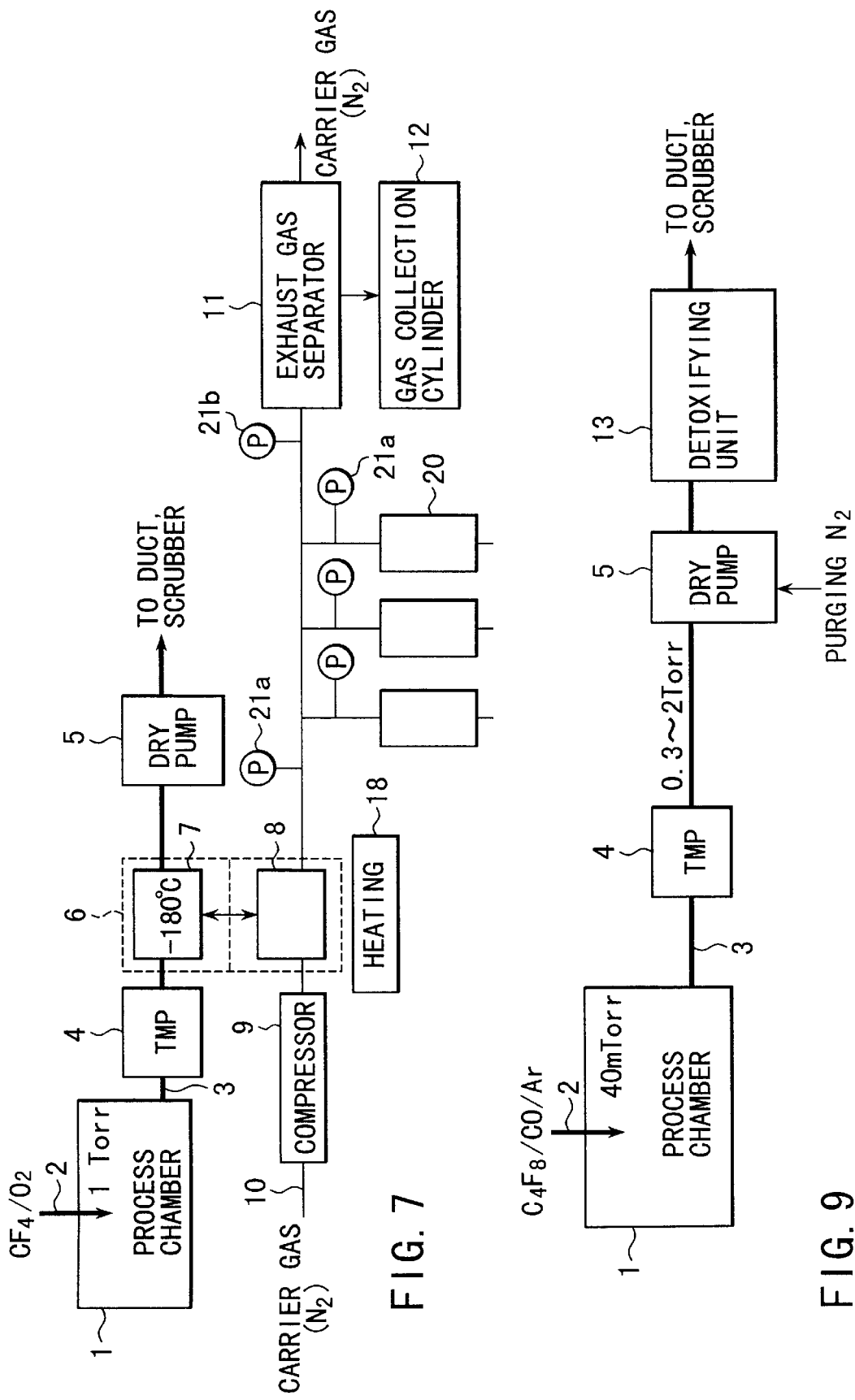

SEMICONDUCTOR PROCESSING SYSTEM AND METHOD OF USING THE SAME

BACKGROUND OF THE INVENTION

The present invention relates to a system for processing the surface of a target substrate by utilizing a gas in accordance with, e.g., film formation, etching, surface modification, impurity doping, or cleaning (removal of contaminants stuck to the surface), and a method of using the same. In other words, the present invention relates to a system for subjecting a target substrate to semiconductor processes, and a method of using the same. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

Semiconductor processes using a reactive gas are widely used in the semiconductor manufacturing technology, e.g., CVD, surface modification, cleaning, and impurity doping, as well as etching. They are also often used in applications other than those employed in direct wafer processes, as in dry cleaning of a process chamber, and dry cleaning of an excimer laser exciting chamber or of the interior of the lens barrel of an electron beam exposure unit.

In semiconductor processes, in addition to harmful gases having high reactivity, many stable gases called PFCs (perfluorocarbons), which are believed to accelerate global warming, are also used. Although PFCs has a smaller production and a smaller exhaust amount than those of $CO_2$, it has a larger relative influence as it has a very high global warming coefficient. For this reason, from the viewpoint of global environment protection, release of PFCs to the atmosphere must be eliminated. Many harmful gases used in semiconductor manufacture are released to the atmosphere without being processed, causing acid rain and environmental destruction. Recently, a detoxifying unit which removes exhaust gases by adsorption using zeolite or active carbon is used. However, the used adsorbent is incinerated or buried, which still imposes a heavy long-term load to the environment.

Various types of methods have been proposed for collection of PFCs. According to one example, exhaust gases filtered by the detoxifying unit are stored in a gas tank once and are transferred to a gas cylinder. The gas cylinder is transported to a gas refining factory, and the filtered exhaust gases are refined and reclaimed. As an in-line collection technique, a membrane having molecular-level fine pores is used to separate PFCs by utilizing the difference in molecular size between PFCs and a diluent gas such as nitrogen gas, thereby selectively collecting PFCs.

The former technique requires.a large-scale gas collection system, which is ineffective in terms of cost unless the same gas is used in a large amount. As semiconductor devices become more advanced, the gases used in semiconductor processes are altered often. Besides, in practice, the types of gas used for the processes vary very widely.

Since the latter technique utilizes a membrane, it is subjected to many limitations concerning the pressure of the gas supplied to the membrane and the concentration of the PFC gas with respect to the diluent gas. Accordingly, in a factory that processes a large amount of gas while arbitrarily repeating ON/OFF of the gas at the respective production units, the supply amount of exhaust gas is very unstable. It is almost impossible to run such a system as an in-line system (wherein the exhaust lines of many units are gathered and the exhaust gases are directly supplied to the separation unit).

FIG. 9 is a block diagram showing a conventional semiconductor wafer plasma etching system.

Referring to FIG. 9, in an etching process chamber 1, an Si wafer as a target substrate is placed on a susceptor. A reactive gas plasma is generated in the process chamber 1 to process a silicon oxide film on the wafer surface. As the etching gas, a gas mixture of $C_4F_8/CO/Ar$ is used. $C_4F_8$ gas is regarded as a type of PFC gas and its exhaust amount will be regulated in the future. However, in semiconductor processes, a gas containing CF (fluorocarbon), e.g., $C_4F_8$, $CF_4$, or $CHF_3$, is indispensable. Therefore, in the semiconductor process field, efforts must be made to suppress the exhaust amount of CF-containing gases.

A gas mixture, the flow rates and mixing ratios of the respective gases of which are controlled, is introduced to the process chamber 1 through a gas supply line 2. The gas causes electric discharge due to an energy such as an RF (Radio-Frequency) power applied to an electrode provided in the process chamber 1, an RF power or microwave supplied from an external coil or antenna, to generate a gas plasma. Active species (F, $CF_x$ or the like having high reactivity) generated by this gas plasma are supplied to the surface of the $SiO_2$ film. Chemical reaction progresses by the energy of ions that come from the plasma and bombard the wafer surface, and etching progresses as a reaction product having a high vapor pressure is produced. Accordingly, gases not decomposed in the plasma, decomposed gases such as F and $CF_x$, gases such as $COF_x$ and $C_xF_y$ generated by reactions of decomposed gases, and etching product gases such as $SiF_x$ (x=1 to 4) and $CO_2$ generated by reactions with the etched film, are exhausted from the process chamber 1.

The gases exhausted from the process chamber 1 to an exhaust line 3 are evacuated by a turbo molecular pump (TMP) 4 serving as a vacuum exhaust unit, and a dry pump 5 arranged downstream the turbo molecular pump 4. The exhaust gases undergo a process of removing harmful substances by a detoxifying unit 13, flow through a duct in the factory to further remove solid matter with a scrubber, and are released into the atmosphere. The detoxifying unit 13 removes active and harmful F, $COF_x$, $C_xF_y$, and the like, or harmful CO and the like by adsorption or combustion. Stable $C_4F_8$ gas passes through the detoxifying unit 13 without being removed and is finally released into the atmosphere, partially contributing to global warming.

According to the conventional collection method, a membrane filter or trap is provided at the output of the scrubber before the final stage, i.e., at the gathered exhaust lines of many units among the factories, so that the gases are separated and collected. With this method, the load on the collection system constantly varies in accordance with a change in operation states of the units, greatly decreasing the collection efficiency. A large amount of purging nitrogen is flowed to the exhaust system, e.g., the dry pump, of each unit in order to dilute harmful reactive gases, so that corrosion and degradation of the pump are suppressed. Hence, the CF-based gas concentration in the gas supplied to the collection system is diluted to less than 0.2% to further decrease the collection efficiency.

In this manner, with the conventional system or method, it is difficult to efficiently collect PFC gas and the like exhausted from the process chamber and the like at a low cost.

BRIEF SUMMARY OF THE INVENTION

The present invention has been made in order to solve the conventional problems described above, and its object is to provide a semiconductor processing system which can efficiently collect PFC gas exhausted from a process chamber at a low cost.

According to a first aspect of the present invention, there is provided a semiconductor processing system comprising: a process chamber for accommodating a target substrate; a support member for supporting the target substrate in the process chamber; a gas supply mechanism for supplying a process gas into the process chamber; an exhaust mechanism for exhausting an interior of the process chamber, the exhaust mechanism having an exhaust line for flowing an exhaust gas, including fluorocarbon gas, from the process chamber; a trap capable of trapping the fluorocarbon gas in the exhaust gas by cooled adsorption and releasing the adsorbed fluorocarbon gas by heating; a regeneration line for releasing the adsorbed fluorocarbon gas from the trap while the trap is separated from the exhaust gas; a collection member connected to the regeneration line to collect the fluorocarbon gas released from the trap; a switching mechanism for switching modes of the trap between a trap mode in which the trap communicates with the exhaust line and a regeneration mode in which the trap communicates with the regeneration line; a cooling member for cooling the trap which is in the trap mode; and a heating member for heating the trap which is in the regeneration mode.

According to a second aspect of the present invention, there is provided a semiconductor processing system comprising: a process chamber for accommodating a target substrate; a support member for supporting the target substrate in the process chamber; a gas supply mechanism for supplying a process gas into the process chamber; an exhaust mechanism for exhausting an interior of the process chamber, the exhaust mechanism having an exhaust line for flowing an exhaust.gas, including fluorocarbon gas, from the process chamber; first and second traps capable of trapping the fluorocarbon gas in the exhaust gas by cooled adsorption and releasing the adsorbed fluorocarbon gas by heating; a regeneration line for releasing the adsorbed fluorocarbon gas from the first and second traps while the first and second traps are separated from the exhaust gas; a collection member connected to the regeneration line to collect the fluorocarbon gas released from the first and second traps; a switching mechanism for alternately switching the first and second traps between a trap mode in which one of the first and second traps communicates with the exhaust line and a regeneration mode in which the other of the first and second traps communicates with the regeneration line; a cooling member for cooling said one of the first and second traps which is in the trap mode; and a heating member for heating the other of the first and second traps which is in the regeneration mode.

According to a third aspect of the present invention, there is provided a method of using the semiconductor processing system of the second aspect, the method comprising: a first trapping step of trapping the fluorocarbon gas in the exhaust gas with the first trap; a first regeneration step of regenerating the second trap, in synchronism with the first trapping step, by releasing the adsorbed fluorocarbon gas from the second trap; a second trapping step of trapping the fluorocarbon gas in the exhaust gas with the second trap; and a second regeneration step of regenerating the first trap, in synchronism with the second trapping step, by releasing the adsorbed fluorocarbon gas from the first trap; wherein the first trapping and regeneration steps and the second trapping and regeneration steps are alternately switched.

According to the present invention, since traps are mounted along the exhaust line, PFC gas can be trapped before, for example, it is diluted very much, and can be collected efficiently at a low cost. While a trap that has trapped PFC gas is retreated and regenerated, a trap that has been regenerated is set along the exhaust line to replace the retreated trap. Therefore, it can trap and collect the gas efficiently.

According to the present invention, a means for introducing a gas, which has passed through the traps provided to the exhaust line, to the process chamber again may be further provided. If a reintroducing means is provided in this manner to recycle the gas, not only removal of harmful gases but also recycling of the gas is enabled, and the burden to the environment that accompanies gas manufacture and harmful gas removing process can be reduced greatly. When harmful gases are removed by adsorption with an adsorbent such as zeolite, the used absorbent must be processed. Either incineration or burial of the used absorbent brings about much burden on the environment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a block diagram showing a semiconductor wafer plasma etching system according to still another embodiment of the present invention;

FIG. 9 is a block diagram showing a conventional semiconductor wafer plasma etching system.

DETAILED DESCRIPTION OF THE INVENTION

Figure 1:
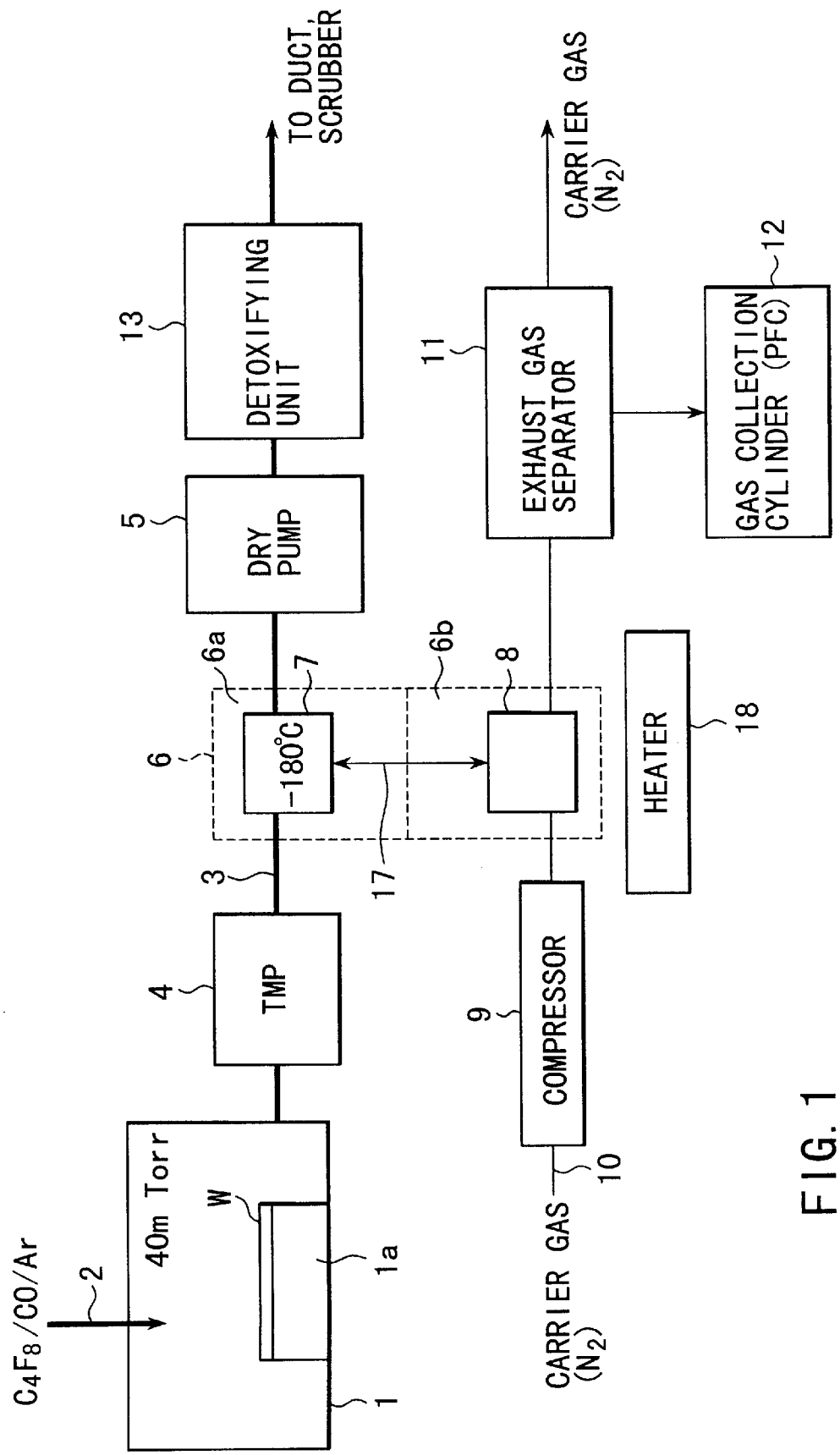
FIG. 1 is a block diagram showing a semiconductor wafer plasma etching system according to an embodiment of the present invention.

FIG. 1 is a block diagram showing a semiconductor wafer plasma etching system according to an embodiment of the present invention.

This embodiment has an arrangement corresponding to the conventional example of FIG. 9. More specifically, concerning a process chamber 1, a gas supply line 2, a gas exhaust line 3, a TMP 4, a dry pump 5, a detoxifying unit 13, and a duct, a scrubber, and the like downstream the detoxifying unit 13, the arrangement of this embodiment is identical to the conventional arrangement shown in FIG. 9.

Referring to FIG. 1, in the etching process chamber 1, an Si wafer W as a target substrate is placed on a susceptor 1a. A reactive gas plasma is generated in the process chamber 1 to process a silicon oxide film on the wafer surface. As the etching gas, a gas mixture of $C_4F_8$/CO/Ar is used.

A gas mixture, the flow rates and mixing ratios of the respective gases of which are controlled, is introduced to the process chamber 1 through the gas supply line 2. The gas produces electric discharge due to an energy such as an RF (Radio-Frequency) power applied to an electrode provided in the process chamber 1, an RF power or microwave supplied from an external coil or antenna, to generate a gas plasma. Gases not decomposed in the plasma, decomposed gases such as F and $CF_x$, gases such as $COF_x$ and $C_xF_y$, generated by reactions of decomposed gases, and etching product gases such as $SiF_x$ (x=1 to 4) and $CO_2$ generated by reactions with the etched film, are exhausted from the process chamber 1.

The gases exhausted from the process chamber 1 to the exhaust line 3 are evacuated by the turbo molecular pump (TMP) 4 serving as a vacuum exhaust unit, and the dry pump 5 provided downstream the turbo molecular pump 4. The exhaust gases undergo a process of removing harmful substances by the detoxifying unit 13, flow through a duct in the factory to further remove solid matter with a scrubber, and are released into the atmosphere.

In this embodiment, a cooling trap unit 6 is further disposed between the TMP 4 and dry pump 5. The cooling trap unit 6 has two traps 7 and 8 which can trap gases such as PFC gas in exhaust gases by cooled adsorption and can release the adsorbed gas, e.g., PFC gas, by heating. FIG. 1 shows a state wherein the trap 7 is set in a trap region 6a of the gas exhaust line 3 (trap mode), and the trap 8 has been retreated from the gas exhaust line 3 and is set in a regenerating region 6b of a regeneration line 10 (to be described later) (regeneration mode). When one trap 7 is saturated, it is switched to the other trap 8 with a switching mechanism 17. The trap separated from the exhaust line 3 is regenerated by releasing the trapped gas with a heating means 18.

The cooling trap unit will be described in further detail with reference to FIGS. 1 and 2.

Figure 2:
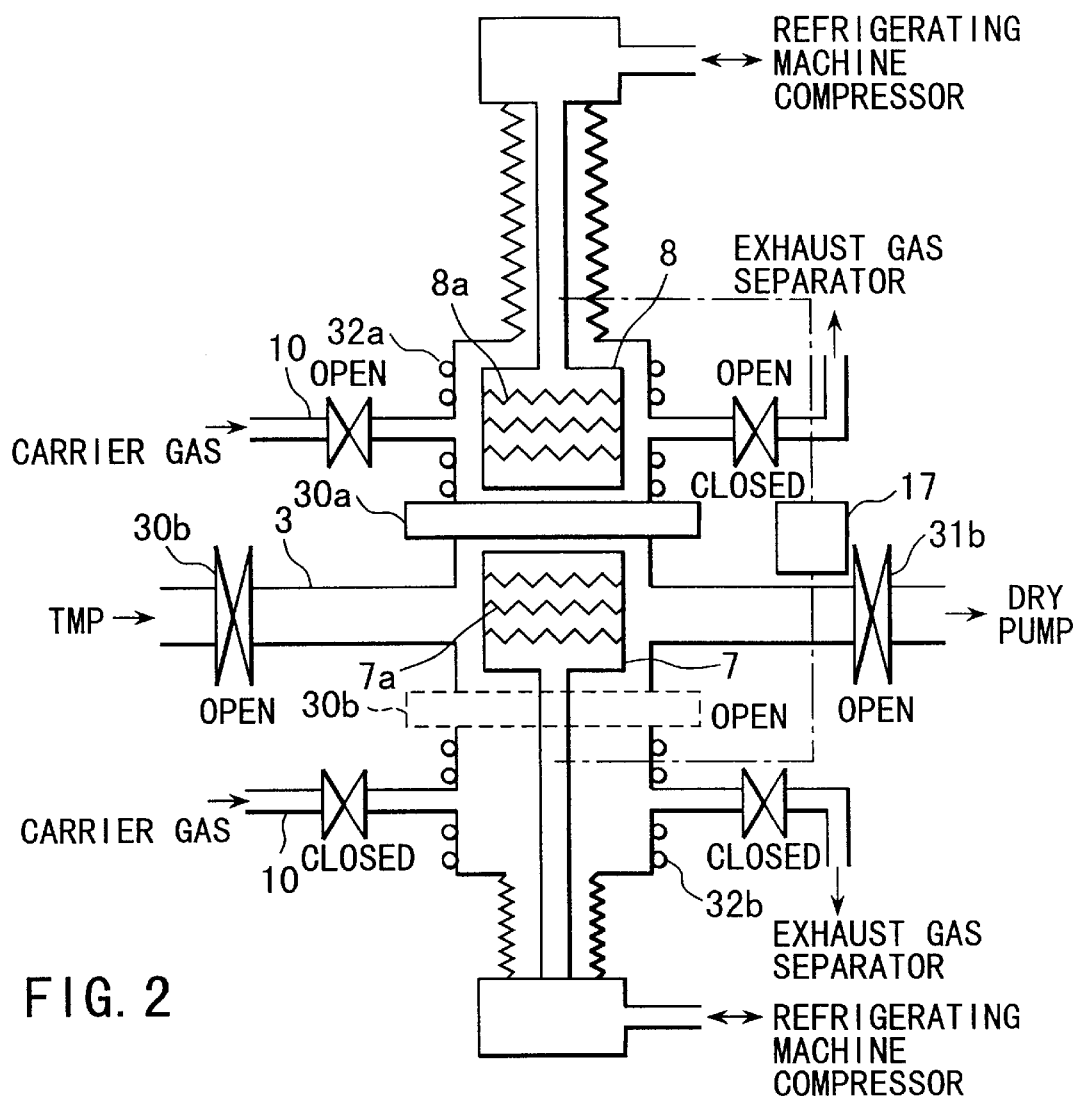
FIG. 2 shows the cooling trap unit of the system shown in FIG. 1.

FIG. 2 shows a state wherein the gas flowing through the exhaust line 3 is trapped with the trap 7 and simultaneously the trap 8 is regenerated. At this time, a gate valve 30a is closed and a gate valve 30b is open. Gate valves 31a and 31b are both open.

Fins 7a and 8a are disposed in the traps 7 and 8, respectively, to sufficiently increase their contact areas with the gas. In the example of FIG. 2, the fin 7a is cooled to an extremely low temperature by a refrigerating machine compressor to trap the gas flowing through the exhaust line 3. The fins 7a and 8a are made of metal, e.g., Cu, and gases such as PFC gas in the exhaust gas are trapped by the surfaces of the fins 7a and 8a. When the traps 7 and 8 are heated, the adsorbed PFC gas and the like are released from the surfaces of the fins 7a and 8a, and the traps 7 and 8 are regenerated. Regardless of the material of the fins 7a and 8a, when PFCs are to be adsorbed, in the trap mode, the traps 7 and 8 are cooled to −120° C. or less and preferably −180° C. or less. In the regeneration mode, the traps 7 and 8 are heated to −100° C. or more and preferably within the range of −100° C. to −50° C.

When several tens of lots of semiconductor wafers are processed and a large amount of gas is adsorbed by the traps, the cooling efficiency declines. In this case, if the temperature of the traps should increase, the gas pressure rises. To prevent this, the traps 7 and 8 are switched at an appropriate timing, and the traps are regenerated by heating. Trap switching is performed by vertically moving the traps 7 and 8 with a vertically movable driver that serves as the switching mechanism 17. The traps may be switched after every predetermined operation period of time, or when the weight of the adsorbed substance trapped by the trap exceeds a predetermined value.

In synchronism with trap regeneration, etching is performed in the process chamber 1, and the exhaust gas is trapped by the trap arranged in the exhaust line 3. Therefore, regeneration itself does not influence the etching time, and regeneration can be performed over a sufficiently long period of time.

Regeneration is done by connecting the trap 8 to the regeneration line 10 separated from the exhaust gas, and by heating the trap 8 with a heater 32a to release the trapped gas. At this time, nitrogen gas may be supplied to the regeneration line 10 as a carrier gas which is inactive against fluorocarbon gases. The nitrogen pressure is supplied by using a compressor 9 shown in FIG. 1 to maintain an exhaust gas separator 11 at an optimum predetermined pressure. Since a trap generates a large amount of gas upon regeneration, the partial pressure of the gas rises simultaneously with the start of regeneration. When a difference between the partial pressure of the gas generated by the trap and the pressure necessary for the exhaust gas separator 11 is compensated for by the carrier gas, an optimum gas separating condition can always be maintained. The gas separated by the exhaust gas separator 11 is sealed in a gas collection cylinder 12 and sent to a gas factory for recycling.

A mechanism that controls heat conduction from the cooling source or the heater to a trap during trapping or regeneration may be provided, so that temperature adjustment may be performed freely. When such a mechanism is provided, a desired gas species can be trapped selectively (to put it differently, a desired gas species can be selectively passed through the trap), or a desired gas species can be selectively released or be collected.

Figure 3:
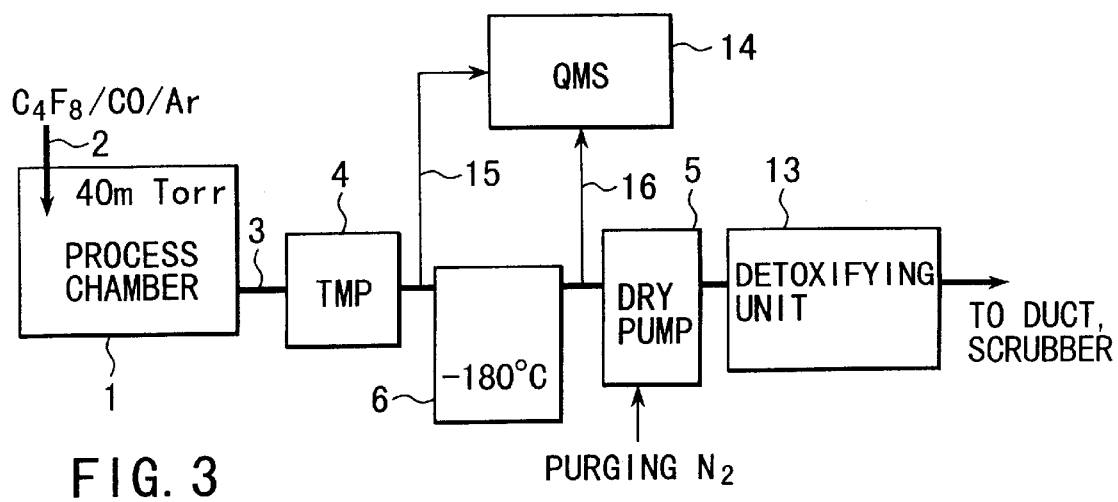
FIG. 3 is a block diagram showing a system used for an experiment concerning the system shown in FIG. 1.
Figures 4, 5:
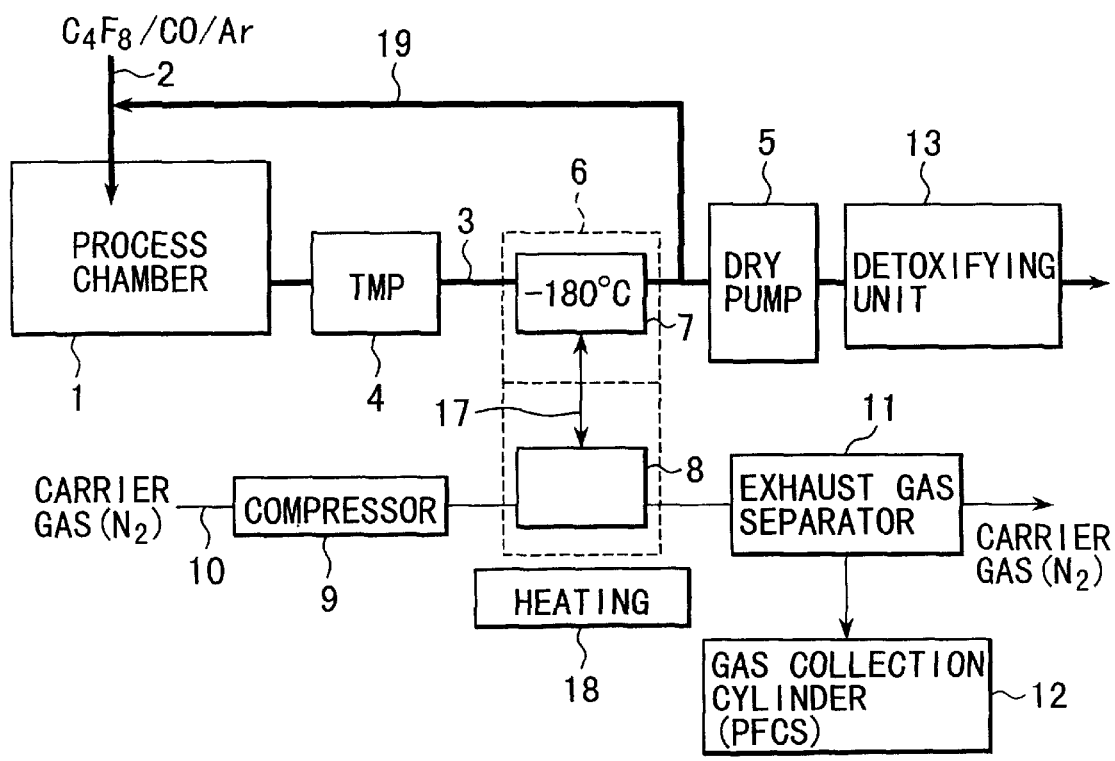
FIG. 4 is a table showing the result of the experiment performed by using the system shown in FIG. 3.
FIG. 5 is a block diagram showing a semiconductor wafer plasma etching system according to another embodiment of the present invention.

In order to examine gas trapping with traps, an experiment was conducted by using the system shown in FIG. 3. In the experiment, gas sampling was performed with a quadruple mass spectrometer 14 by sampling gases before and after the cooling trap unit 6 (spectroscopic gas sampling lines 15 and 16), and molecular composition spectroscopy of the gases was performed. $C_4F_8$, CO, and Ar were introduced into the process chamber 1 at 20 SCCM, 300 SCCM, and 380 SCCM, respectively, and the gases exhausted when actually etching an $SiO_2$ film by using a photoresist as a mask were examined. FIG. 4 shows the result.

Of the detected gases, major ones are $C_4F_8$, $C_2F_6$, $CF_4$, $SiF_4$, CO, and Ar. The proportion of the produced gas detected before the trap to the introduced gas is about 30% to 60% in the case of $C_4F_8$ gas. This means that 40% to 70% of the gas was consumed by etching or vapor phase reaction. $SiF_4$ is probably an etching product and both $C_2F_6$ and $CF_4$ are probably gas reaction products, each of which exists in about several % to the total gas. After passing through the trap at −180° C., $C_4F_8$, $C_2F_6$, $CF_4$, and $SiF_4$ are entirely removed, and only gases, e.g., CO and Ar, having higher vapor pressures pass through the trap.

Although this is a case when the trap temperature is −180° C., the gases that pass through the trap can be selected by controlling the temperature of the trap.

FIG. 5 is a block diagram showing a semiconductor wafer plasma etching system according to another embodiment of the present invention.

This embodiment is obtained by providing a system, identical to that of the embodiment shown in FIG. 1, with a branch line 19 downstream a cooling trap unit 6 of a gas exhaust line 3. A gas exhausted from a process chamber 1 flows through a valve (not shown), a pressure control mechanism, and a gas mixing mechanism, and merges with a primary gas supply line 2 through the branch line (circulating line) 19. Part of the merged gas is returned to the process chamber 1. In this system, the gas that has passed through the trap is not directly exhausted but is utilized effectively, and furthermore, the gas passing through the trap is returned after its composition is controlled by adjusting the temperature of the trap, so that the process performance is improved. Except for this, the basic running method is identical to that of the embodiment shown in FIG. 1.

Figure 6:
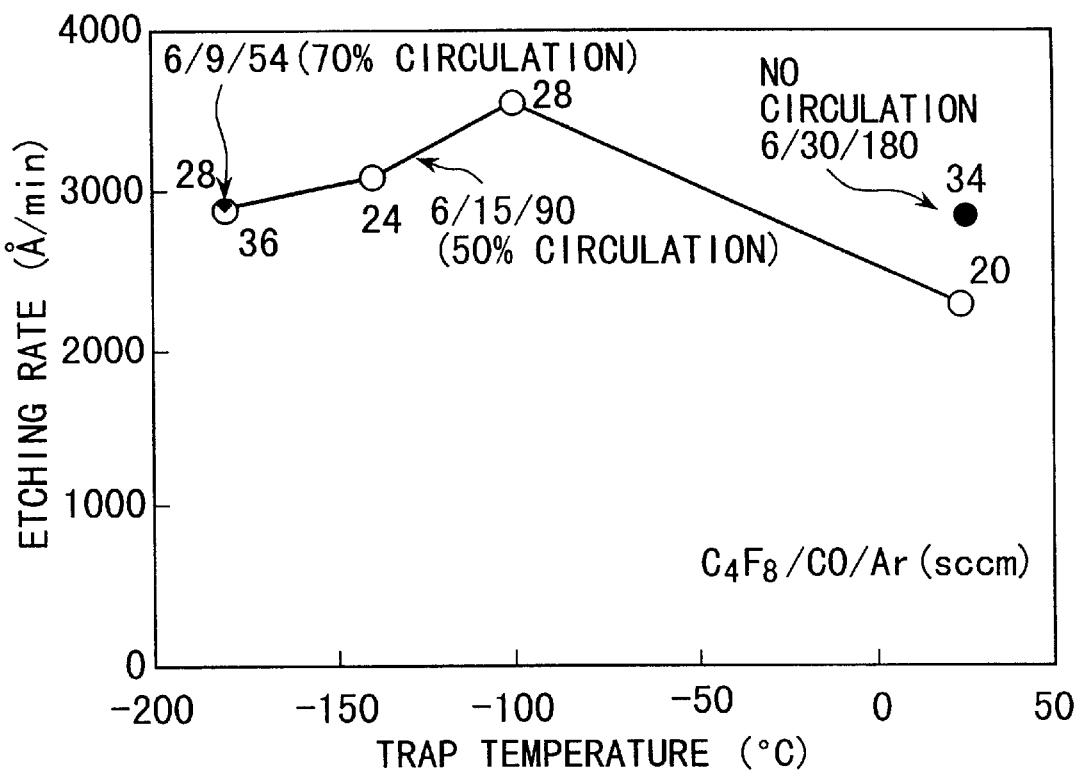
FIG. 6 is a graph showing the result of an experiment concerning the system shown in FIG. 5.

FIG. 6 shows part of the evaluation result of the process that uses the system of this embodiment.

The experiment was conducted by using $C_4F_8$/CO/Ar as the gas to be introduced into the process chamber 1 and by setting the effective total gas flow rate to 6/30/180 SCCM. In the experiment, the etching rate of the $SiO_2$ film with respect to the trap temperature was obtained. As an experiment sample, a pattern of 0.6-$\mu$m diameter contact holes was formed by using a resist mask.

The etching rate at room temperature with no gas circulation was indicated by a black circle. In contrast to this, when the gas was circulated by 50% (the original gas flow rate was set to satisfy $C_4F_8$/CO/Ar=6/15/90 SCCM, and the insufficient flow rate of CO/Ar=15/90 SCCM was supplied from the circulation line), the etching rate decreased, and the etching selectivity for Si also decreased from 34 to 20. This is because the etching product was returned through the circulation line to suppress the etching reaction.

In contrast to this, with 50% gas circulation, the characteristics were evaluated while changing the trap temperature to −180° C., −140° C., and −100° C. As a result, the etching characteristics at −180° C. were nearly equal to those obtained with no circulation at room temperature (black circle). In fine, performance identical to that obtained with no circulation is obtained presumably because the etching product was completely removed by the trap.

The proportion of gas circulation can be further increased. For example, it is possible to circulate CO and Ar almost 100% and to replenish only CO decomposed by the plasma. When the gas is circulated almost 100% in this manner, especially the flow rate of the gas to be exhausted by the dry pump on the downstream of the exhaust system decreases greatly. Consequently, the dry pump can be made compact (achieving a great energy conservation and space economization), and the detoxifying unit can be made compact or becomes unnecessary, thereby greatly reducing the load on the environment.

Returning back to the experimental result of FIG. 6, at the trap temperature of −140° C., the etching rate improved. When the etching shape was observed, better anisotropy was obtained than that obtained with no gas circulation, achieving an essentially vertical etching shape.

In this manner, when the system of this embodiment is used, many effects can be obtained, for example, PFCs can be collected completely, the amount of gas effectively used can be decreased, the system cost can be decreased, and the process performance is improved.

FIG. 7 is a block diagram showing a semiconductor wafer plasma etching system according to still another embodiment of the present invention.

In this system, a plurality of system units 20 each identical to the embodiment shown in FIG. 1 are provided. The respective system units have corresponding cooling trap units, and collection of gases from the respective traps is performed with one exhaust gas separator 11.

A valve (not shown) and a pressure gauge 21a are connected to the gas exhaust line of each system unit to constantly monitor the pressure of the collected gas. Another pressure gauge 21b is connected to the exhaust gas separator 11. The heating generation temperature, the pressure and flow rate of the carrier gas, and the like of the respective system units are controlled such that the pressure detected by the pressure gauge 21b indicates a value optimum for gas separation.

In this embodiment, gas collection is performed off-line by combination with traps, so that a large-scale system can be formed easily. The performance of the gas separation system using a membrane or the like is exploited most effectively, which effectively influences the gas collection/environment protection system as a whole factory.

Figure 8:
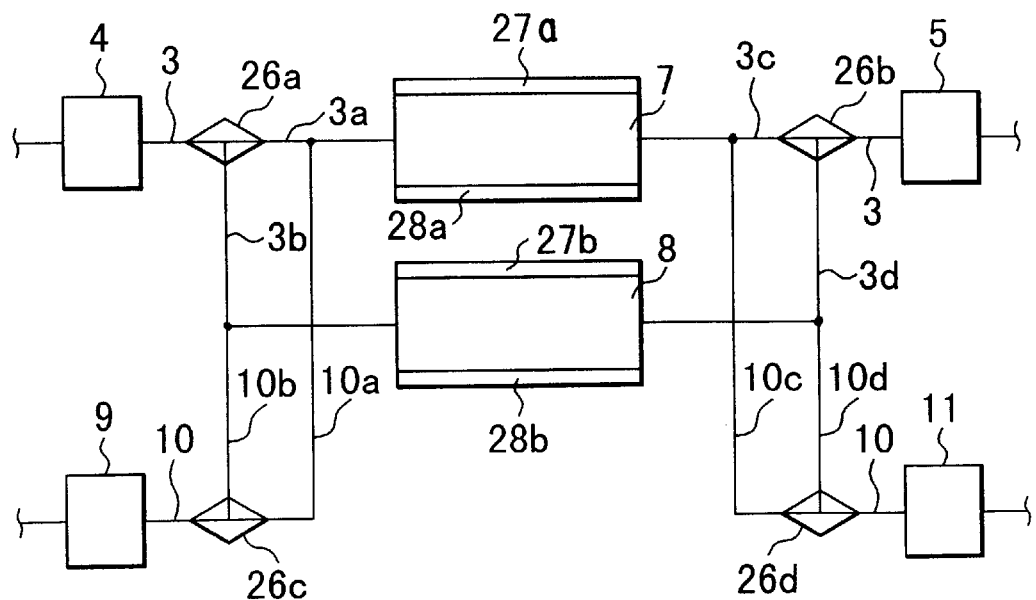
FIG. 8 shows a modification of the cooling trap unit.

FIG. 8 shows a modification of a cooling trap unit.

As shown in FIG. 8, in a cooling trap unit 25 of this modification, the upstream side of an exhaust line 3 is branched by a three-way valve 26a into lines 3a and 3b respectively connected to traps 7 and 8. The downstream side of the exhaust line 3 is branched by a three-way valve 26b into lines 3c and 3d respectively connected to the traps 7 and 8. The upstream side of a regeneration line 10 is branched by a three-way valve 26c into lines 10a and 10b respectively connected to traps 7 and 8. The downstream side of the regeneration line 10 is branched by a three-way valve 26d into lines 10c and 10d respectively connected to the traps 7 and 8. The traps 7 and 8 are provided with cooling means 27a and 27b and heating means 28a and 28b.

More specifically, in the cooling trap unit 6 described with reference to FIGS. 1 to 7, the mechanism for alternately switching the two traps 7 and 8 between the trap mode and regeneration mode is designed to move the traps 7 and 8 between the exhaust line 3 and regeneration line 10 with the vertically movable driver. In contrast to this, in the cooling trap unit 25 of this modification, the mechanism for alternately switching the two traps 7 and 8 between the trap mode and regeneration mode is designed to selectively communicate the exhaust line and regeneration. line with the traps 7 and 8 by switching the valves 26a to 26d.

The characteristic feature of the present invention described with reference to FIGS. 1 to 8 is not limited to those of these embodiments. For example, in addition to etching, the present invention can also be applied to other semiconductor processes such as CVD, surface modification, cleaning, impurity doping, and dry cleaning of process chambers for these processes that use gases. The present invention can also be used in applications other than those employed by direct wafer processing, as in dry cleaning of an excimer laser exciting chamber and of the interior of the lens barrel of an electron beam exposure unit that utilize a gas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing system comprising:
    a process chamber for accommodating a target substrate;
    a support member for supporting the target substrate in said process chamber;
    a gas supply mechanism for supplying a process gas into said process chamber;
    an exhaust mechanism having an exhaust line connected to said process chamber, for flowing an exhaust gas, including fluorocarbon gas, from said process chamber, and having an exhaust pump disposed on said exhaust line, for exhausting an interior of said process chamber;
    a trap capable of trapping the fluorocarbon gas in the exhaust gas by cooled adsorption and releasing the adsorbed fluorocarbon gas by heating;
    a regeneration line for releasing the adsorbed fluorocarbon gas from said trap while said trap is separated from the exhaust gas;
    a collection member connected to said regeneration line to collect the fluorocarbon gas released from said trap;
    a switching mechanism for switching modes of said trap between a trap mode in which said trap communicates with said exhaust line and a regeneration mode in which said trap communicates with said regeneration line, wherein said trap when in the trap mode is inserted between said process chamber and said exhaust pump;
    a cooling member for cooling said trap which is in the trap mode; and
    a heating member for heating said trap which is in the regeneration mode,
    wherein said cooling member cools said trap of which is in the trap mode to a specific temperature not more than $-120°$ C., and said specific temperature is set such that the fluorocarbon gas is adsorbed on said trap by cooled adsorption, and another gas having a vapor pressure higher than that of the fluorocarbon gas passes through said trap.

2. The system according to claim 1, further comprising a carrier gas supply mechanism connected to said regeneration line to supply a carrier gas, inactive against the fluorocarbon gas, to said trap which is in the regeneration mode.

3. The system according to claim 2, further comprising a gas separation member for separating the carrier gas and the fluorocarbon gas from each other.

4. The system according to claim 2, wherein the carrier gas is nitrogen gas.

5. The system according to claim 1, further comprising a return line connected to said exhaust line between said trap which is in the trap mode and said exhaust pump, to return the exhaust gas to said process chamber.

6. The system according to claim 1, wherein a turbo molecular pump and said exhaust pump, which consists of a dry pumps are disposed on said exhaust line, and said trap which is in the trap mode is interested between said turbo molecular pump and said dry pump.

7. The system according to claim 1, wherein said switching mechanism moves said trap between said exhaust line and said regeneration line.

8. The system according to claim 1, wherein said switching mechanism selectively causes said exhaust line and said regeneration line to communicate with said trap in accordance with valve switching.

9. The system according to claim 1, wherein said heating member heats said trap which is in the regeneration mode to not less than $-100°$ C.

10. The system according to claim 1, wherein said trap is one of a plurality of traps which are alternatively connected to said exhaust line and brought into the trap mode.

11. The system according to claim 1, wherein said heating member heats said trap which is in the regeneration mode to a temperature within the range of $-100°$ C. to $-50°$ C.

12. The system according to claim 1, wherein said specific temperature is not more than $-180°$ C.

13. The system according to claim 1, wherein a gas supply is connected to said exhaust line, for supplying a dilution gas to dilute the exhaust gas, and said trap which is in the trap mode is inserted between said process chamber and a position at which said gas supply is connected.

14. A semiconductor processing system comprising:
    a process chamber for accommodating a target substrate;
    a support member for supporting the target substrate in said process chamber;
    a gas supply mechanism for supplying a process gas into said process chamber;
    an exhaust mechanism having an exhaust line connected to said process chamber, for flowing an exhaust gas, including fluorocarbon gas, from said process chamber, and having an exhaust pump disposed on said exhaust line, for exhausting an interior of said process chamber;
    first and second traps capable of trapping the fluorocarbon gas in the exhaust gas by cooled adsorption and releasing the adsorbed fluorocarbon gas by heating;
    a regeneration line for releasing the adsorbed fluorocarbon gas from said first and second traps while said first and second traps are separated from the exhaust gas;
    a collection member connected to said regeneration line to collect the fluorocarbon gas released from said first and second traps;
    a switching mechanism for alternately switching said first and second traps between a trap mode in which one of said first and second traps communicates with said exhaust line and a regeneration mode in which the other of said first and second traps communicates with said regeneration line, wherein said one of said first and second traps when in the trap mode is inserted between said process chamber and said exhaust pump;
    a cooling member for cooling said one of said first and second traps which is in the trap mode; and
    a heating member for heating said other of said first and second traps which is in the regeneration mode,
    wherein said cooling member cools said one of said first and second traps which is in the trap mode to a specific temperature not more than $-120°$ C., and said specific, temperature is set such that the fluorocarbon gas is adsorbed on said one of said first and second traps by cooled adsorption, and another gas having a vapor pressure higher than that of the fluorocarbon gas passes through said one of said first and second traps.

15. The system according to claim 14, further comprising a carrier gas supply mechanism connected to said regeneration line to supply a carrier gas, inactive against the fluorocarbon gas, to said other of said first and second traps which is in the regeneration mode.

16. The system according to claim 15, further comprising a gas separation member for separating the carrier gas and the fluorocarbon gas from each other.

17. The system according to claim 15, wherein the carrier gas is nitrogen gas.

18. The system according to claim 14, further comprising a return line connected to said exhaust line between said one of said first and second traps which is in the trap mode and said exhaust pump, to return the exhaust gas to said process chamber.

19. The system according to claim 14, wherein a turbo molecular pump and said exhaust pump, which consists of a dry pump, are disposed on said exhaust line, and said one of said first and second traps which is in the trap mode is inserted between said turbo molecular pump and said dry pump.

20. The system according to claim 14, wherein said switching mechanism moves said first and second traps between said exhaust line and said regeneration line.

21. The system according to claim 20, wherein said first and second traps are located, in the trap mode, at a substantially single trap position, and in the regeneration mode, at two regeneration positions opposing each other through the trap position.

22. The system according to claim 14, wherein said switching mechanism selectively causes said exhaust line and said regeneration line to communicate with said first and second traps in accordance with valve switching.

23. The system according to claim 14, wherein said heating member heats said other of said first and second traps which is in the regeneration mode to not less than −100° C.

24. A method of using said semiconductor processing system according to claim 14, said method comprising:

a first trapping step of trapping the fluorocarbon gas in the exhaust gas with said first trap;

a first regeneration step of regenerating said second trap, in synchronism with the first trapping step, by releasing the adsorbed fluorocarbon gas from said second trap;

a second trapping step of trapping the fluorocarbon gas in the exhaust gas with said second trap; and a second regeneration step of regenerating said first trap, in synchronism with the second trapping step, by releasing the adsorbed fluorocarbon gas from said first trap; wherein the first trapping and regeneration steps and the second trapping and regeneration steps are alternately switched.

25. The method according to claim 24, wherein said heating member heats said other of said first and second traps which is in the regeneration mode to not less than −100° C.

26. The system according to claim 14, wherein said heating member heats said other of said first and second traps which is in the regeneration mode to a temperature within a range of −100° C. to −50° C.

27. The system according to claim 14, wherein said specific temperature is not more than −180° C.

28. The system according to claim 14, wherein a gas supply is connected to said exhaust line, for supplying a dilution gas to dilute the exhaust gas, and said one of said first and second traps which is in the trap mode is inserted between said process chamber and a position at which said gas supply is connected.

* * * * *

UNITED STATES PATENT AND TRADEMARK OFFICE
CERTIFICATE OF CORRECTION

PATENT NO. : 6,334,928 B1
DATED : January 1, 2002
INVENTOR(S) : Sekine et al.

It is certified that error appears in the above-identified patent and that said Letters Patent is hereby corrected as shown below:

Column 9,
Line 60, change "pumps are" to -- pump, are --.

Column 10,
Line 54, change "specific," to -- specific --.

Signed and Sealed this

Eleventh Day of February, 2003

JAMES E. ROGAN
*Director of the United States Patent and Trademark Office*